United States Patent
Chen et al.

(10) Patent No.: US 10,700,202 B2
(45) Date of Patent: Jun. 30, 2020

(54) SEMICONDUCTOR DEVICE AND METHOD FOR FORMING THE SAME

(71) Applicant: UNITED MICROELECTRONICS CORP., Hsin-Chu (TW)

(72) Inventors: Kuang-Hsiu Chen, Tainan (TW); Sung-Yuan Tsai, Yunlin County (TW); Chi-Hsuan Tang, Kaohsiung (TW); Kai-Hsiang Wang, Taichung (TW); Chao-Nan Chen, Tainan (TW); Shi-You Liu, Kaohsiung (TW); Chun-Wei Yu, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 96 days.

(21) Appl. No.: 16/172,856

(22) Filed: Oct. 28, 2018

(65) Prior Publication Data
US 2020/0098916 A1 Mar. 26, 2020

(30) Foreign Application Priority Data
Sep. 26, 2018 (TW) .............................. 107133768 A (51) Int. Cl.
| H01L 29/76 | (2006.01) |
| H01L 29/78 | (2006.01) |
| H01L 29/165 | (2006.01) |
| H01L 29/66 | (2006.01) |
| H01L 21/265 | (2006.01) |

(52) U.S. Cl.
CPC .... *H01L 29/7848* (2013.01); *H01L 21/26506* (2013.01); *H01L 21/26586* (2013.01); *H01L 29/165* (2013.01); *H01L 29/6653* (2013.01); *H01L 29/6659* (2013.01); *H01L 29/66636* (2013.01); *H01L 29/7833* (2013.01)

(58) Field of Classification Search
CPC ........... H01L 21/26506; H01L 29/0653; H01L 29/0895; H01L 21/26586; H01L 29/165; H01L 29/6653; H01L 29/6659; H01L 29/66636; H01L 29/66643; H01L 29/7833; H01L 29/7839; H01L 29/7848
USPC ........ 438/300, 434, 585; 257/155, 288, 327, 257/369
See application file for complete search history.

(56) References Cited

U.S. PATENT DOCUMENTS

| 9,735,047 B1* | 8/2017 | Chang ................. H01L 21/7682 |
| 2009/0280627 A1 | 11/2009 | Pal |
| 2018/0174913 A1* | 6/2018 | More .............. H01L 21/823431 |

* cited by examiner

*Primary Examiner* — Brook Kebede
(74) *Attorney, Agent, or Firm* — Winston Hsu (57) ABSTRACT

A semiconductor device is disclosed. The semiconductor device comprises a substrate, a gate structure disposed on the substrate, a spacer disposed on the substrate and covering a sidewall of the gate structure, an air gap sandwiched between the spacer and the substrate, and a source/drain region disposed in the substrate and having a faceted surface exposed from the substrate, wherein the faceted surface borders the substrate on a boundary between the air gap and the substrate.

20 Claims, 5 Drawing Sheets

SEMICONDUCTOR DEVICE AND METHOD FOR FORMING THE SAME

BACKGROUND OF THE INVENTION

1. Field of the Invention

The present invention generally relates to a semiconductor device and method for forming the same. More particularly, the present invention relates to a semiconductor device comprising source/drain stressors and method for forming the same.

2. Description of the Prior Art

In advanced semiconductor manufacturing, to boost the carrier mobility, one conventional attempt has been made by forming a strained silicon channel. The strained silicon channel can increase the carrier mobility, thereby improving the operation speed of the semiconductor device. One method for forming a strained silicon channel is forming the source/drain regions as the stressors at two sides of the channel by selective epitaxial growth (SEG). The epitaxial layers of the source/drain regions may have a lattice arrangement different from the lattice constant of the substrate (the channel) by comprising dopants. The mismatch of the lattice constants between the source/drain regions and the substrate may induce a desired type and magnitude of stress to the channel region to improve the drive current.

Raised source/drain (RSD) regions are also proposed to reduce the leakage current between the source/drain regions when the channel is off. Conventionally, a raised source/drain region may be formed by overgrow the epitaxial layer to form a raised portion above the upper surface of the substrate. However, the raised portion tends to grow along the sidewall of the spacer and consequently directly covers a lower sidewall of the spacer. This will adversely cause a higher parasitic capacitance between the source/drain region and the gate.

SUMMARY OF THE INVENTION

In light of the above, the present invention is directed to provide a semiconductor device and method for forming the same which may reduce the parasitic capacitance between the source/drain region and the gate.

According to one embodiment of the present invention, a semiconductor device is disclosed. The semiconductor device comprises a substrate, a gate structure disposed on the substrate, a spacer disposed on the substrate and covering a sidewall of the gate structure, an air gap sandwiched between the spacer and the substrate, and a source/drain region disposed in the substrate and having a faceted surface exposed from the substrate, wherein the faceted surface borders the substrate on a boundary between the air gap and the substrate.

According to another embodiment of the present invention, a method for forming a semiconductor device is disclosed, which comprises the following steps. First, a substrate is provided. A gate structure is formed on the substrate. A shallow doped region is then formed in the substrate adjacent to the gate structure. A spacer is then formed on the shallow doped region in substrate and on a sidewall of the gate structure. Subsequently, an etching process is performed to form a deep recess in the substrate adjacent to the spacer and an air gap between the spacer and the substrate. After that, an epitaxial process is performed to form a source/drain region completely filling the deep recess, wherein an edge of the faceted surface is on a boundary between the air gap and the substrate It is one feature of the present invention that a narrow air gap is purposely formed between the spacer and the substrate to force the raised portion of the source/drain region to grow along direction away from the spacer. Therefore, the raised portion of the source/drain region will not cover on the spacer, and the parasitic capacitance between the source/drain region and the gate is reduced.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 are schematic cross-sectional diagrams illustrating successive steps for forming a semiconductor device according to a preferred embodiment of the present invention, in which:

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

Figure 1:
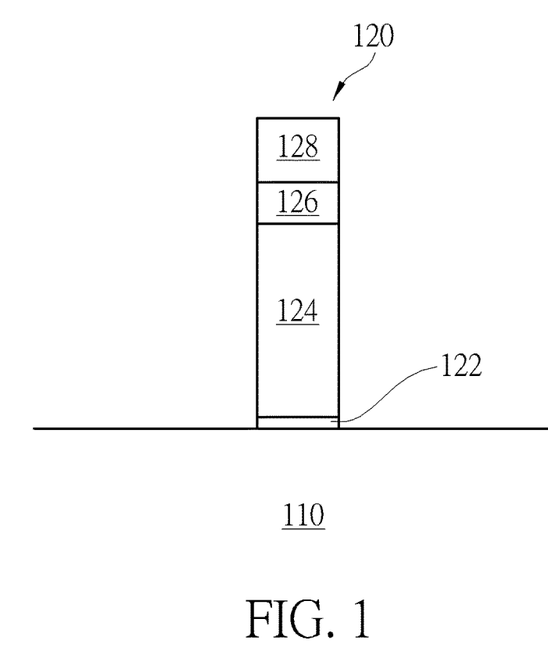
FIG. 1 shows the beginning of the method, when a gate structure is formed on a substrate.

Please refer to FIG. 1 to FIG. 9, which are schematic cross-sectional diagrams illustrating successive steps for forming a semiconductor device according to a preferred embodiment of the present invention. As shown in FIG. 1, a substrate 110 is provided. The substrate 110 may comprise a silicon substrate, a silicon-in-insulator (SOI) substrate or other semiconductor substrate, but not limited thereto. A gate structure 120 is formed on the substrate 110. According to an embodiment, the gate structure 120 may include, from bottom to top, a gate dielectric layer 122, a sacrificial gate layer 124, a pad layer 126 and a cap layer 128. The gate dielectric layer 122 may be made of silicon oxide, but not limited thereto. The sacrificial gate layer 124 may be made of polysilicon, but not limited thereto. The pad layer 126 may be made of silicon nitride, but not limited thereto. The cap layer 128 may be made of silicon oxide, but not limited thereto. The gate structure 120 may be a dummy gate structure which is to define the position of a replacement metal gate structure (shown in FIG. 9). In other embodiments, the gate structure 120 may be a polysilicon gate and will not be substituted by a metal gate structure.

Figure 2:
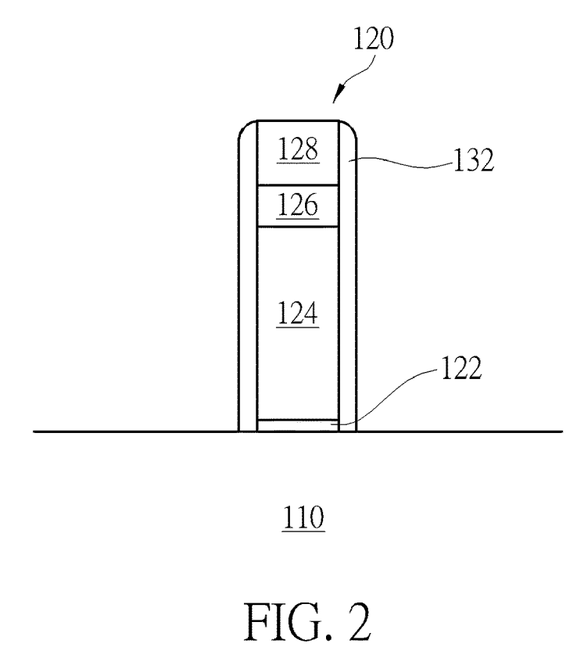
FIG. 2 shows the step of forming a first spacer on the gate structure.

Subsequently, as shown in FIG. 2, a first spacer 132 is formed on the substrate 110 and covering the sidewall of the gate structure 120. According to an embodiment, the material of the first spacer 132 may comprise $SiO_2$, SiN, SiON or SiCN, but not limited thereto. Preferably, the first spacer 132 comprises SiCN. The first spacer 132 may be formed by first forming a first spacer material layer conformally covering the substrate 110 and the top surface and sidewall of the gate structure 120, and then performing an anisotropic etching process to remove the first spacer material layer on the substrate 110 and on the top surface of the gate structure 120. The remaining first spacer material layer on the sidewall of the gate structure 120 becomes the first spacer 132.

Figure 3:
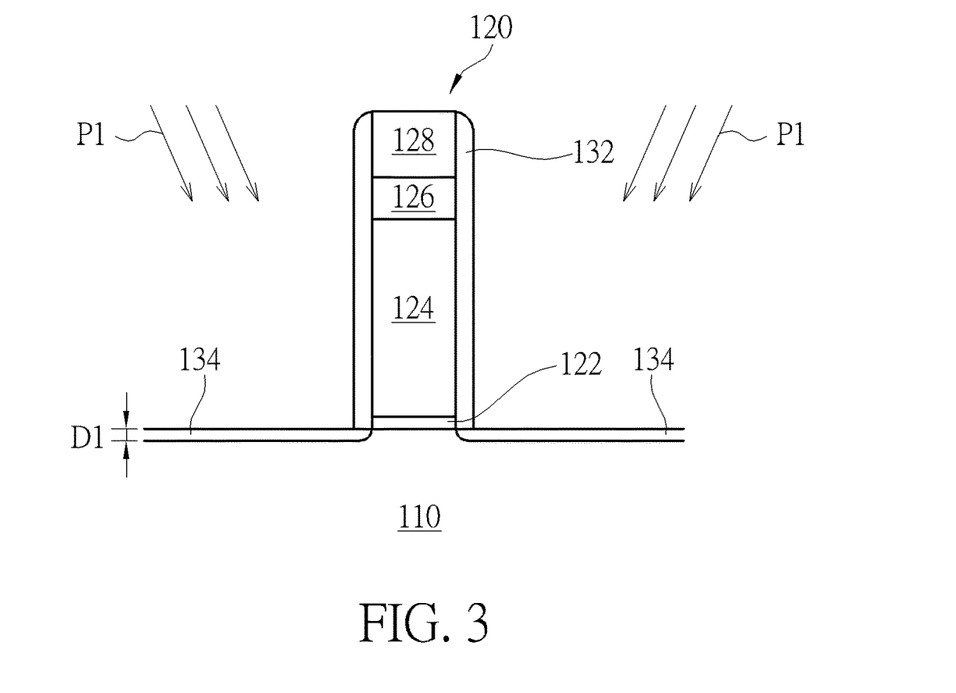
FIG. 3 shows the step of forming a shallow doped region in the substrate at two sides of the gate structure.

After forming the first spacer 132, as shown in FIG. 3, by using the gate structure 120 and the first spacer 132 as an implanting mask, a first implanting process P1 is performed to implant amorphizing ions at a first tilt angle into the substrate 110 to form a shallow doped region 134 in the substrate 110. The shallow doped region 134 is formed at two sides of the gate structure 120 and adjacent to the gate structure 120. According to an embodiment, the species of the amorphizing ionsmay include silicon (Si), carbon (C), germanium (Ge), phosphorous (P), arsenic (As), or inert gas such as argon (Ar) or xenon (Xe), but not limited thereto. Preferably, the species of the amorphizing ions is Xe. The shallow doped region 134 is an at least partially amorphized region of the substrate 110.

The depth of the shallow doped region 134 may vary by adjusting the power and tilt angle of the first implanting process P1. According to an embodiment, the amorphizing ions may be implanted into the substrate 110 in a dosage between 1E12 to 1E14 atoms/$cm^2$ and at a tilt angle of about 5 degrees against an axis perpendicular to the upper surface of the substrate 110 and at an energy of about 1 to 5 keV. Preferably, the shallow doped region 134 may have a depth D1 between 10 to 40 angstroms. According to an embodiment, the shallow doped region 134 may have an extending portion underlying the first spacer 132.

Figure 4:
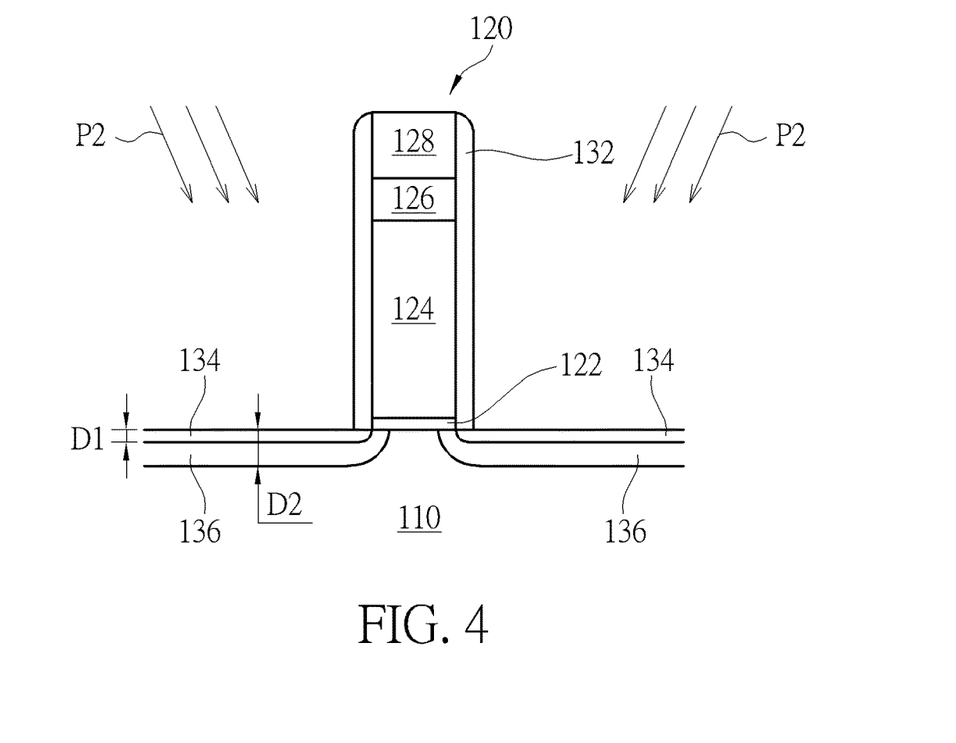
FIG. 4 shows the step of forming a lightly-doped region in the substrate at two sides of the gate structure.

Please refer to FIG. 4. Optionally, also by using the gate structure 120 and the first spacer 132 as an implanting mask, a second implanting process P2 may be performed to implant conductive dopants into the substrate 110 to form a lightly-doped region 136 in the substrate 110 at two sides of the gate structure 120 and adjacent to the gate structure 120. The species of the conductive dopants is chosen depending on the conductive type of the semiconductor device. For example, when the semiconductor device is n-type, the conductive dopants may include P, As, Sb, or other suitable n-type conductive dopants. On the other hand, when the semiconductor device is p-type, the conductive dopants may include B, $BF_2$, or other suitable p-type conductive dopants.

Similarly, the depth of the lightly-doped region 136 may vary by adjusting the power and tilt angle of the second implanting process P2. According to an embodiment, preferably, the conductive dopants of the second implanting process P2 may be implanted into the substrate 110 at tilt angle larger than the tilt angle of the amorphizing ions in the first implanting process P1, such as between 7 to 8 degrees against the axis perpendicular to the upper surface of the substrate 110, and at an energy larger than the energy of the amorphizing ions in the first implanting process P1, such as between 1 to 30 keV. The depth D2 of the lightly-doped region 136 is deeper than the depth D1 of the shallow doped region 134. The lightly-doped region 136 may also as an extending portion, extending laterally farther than the shallow doped region 134 and underlying the first spacer 132 and a portion of the gate structure 120. As shown in FIG. 4, the lightly-doped region 136 may completely encompass the shallow doped region 134. The sequence of forming the shallow doped region 134 and the lightly-doped region 136 may exchange. For example, the second implanting process P2 may be performed before performing the first implanting process P2.

Figure 5:
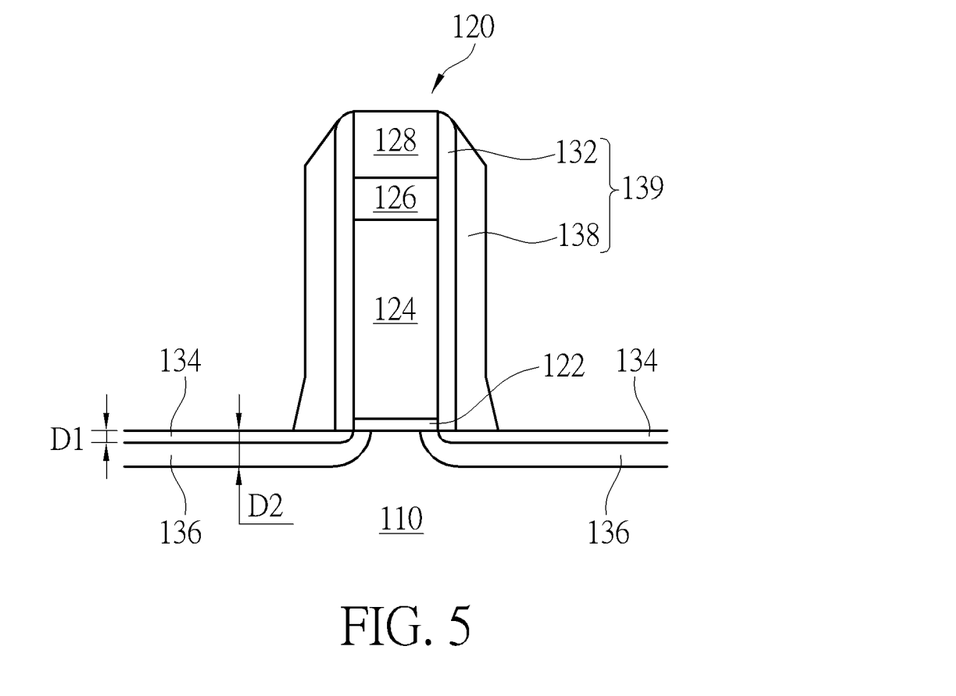
FIG. 5 shows the step of forming a second spacer on the first spacer.

Please refer to FIG. 5. Subsequently, a second spacer 138 is formed on the on the substrate 110 and covering the first spacer 132. According to an embodiment, the material of the second spacer 138 may include $SiO_2$, SiN, SiON or SiCN, but not limited thereto. Preferably, the second spacer comprises SiN. Similar to the process of forming the first spacer 132, the second spacer 138 may be formed by first forming a second spacer material layer conformally covering the substrate 110, the top surface of the gate structure 120 and the first spacer 132 on the sidewall of the gate structure 120, and then performing an anisotropic etching process to remove the second spacer material layer on the substrate 110 and on the top surface of the gate structure 120. The remaining second spacer material layer on the first spacer 132 becomes the second spacer 138. Notably, the bottom surface of the second spacer 138 is completely overlapping on the shallow doped region 134. The first spacer 132 and the second spacer 138 collectively form the spacer 139, which may be used as an etching mask to define the region of a deep recess for forming the source/drain region.

Figure 6:
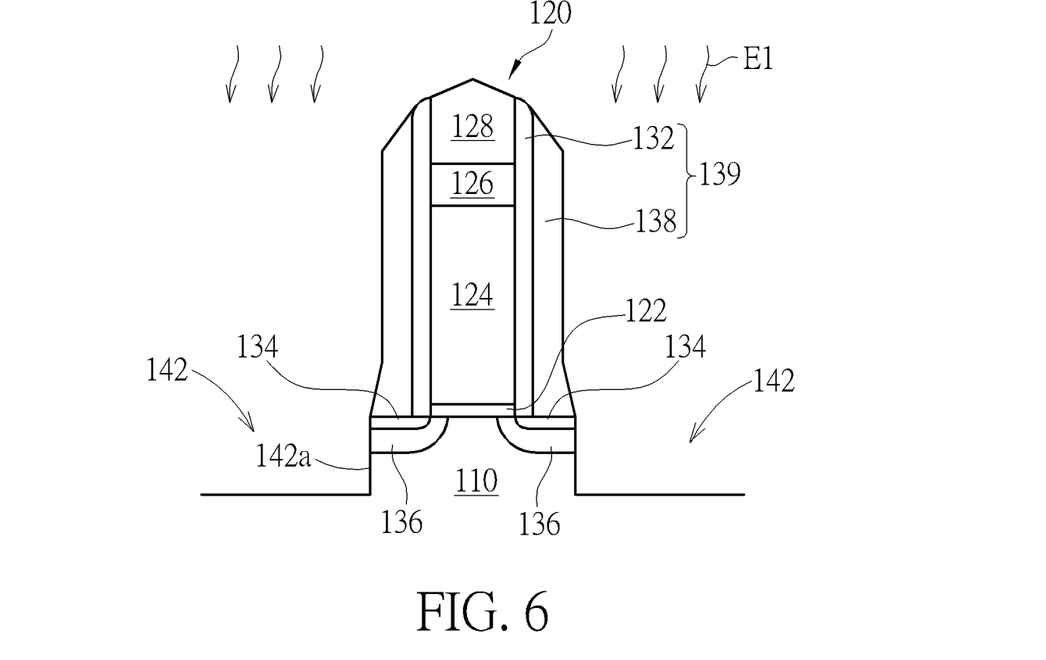
FIG. 6 shows the step of forming a first recess in the substrate.
Figure 7:
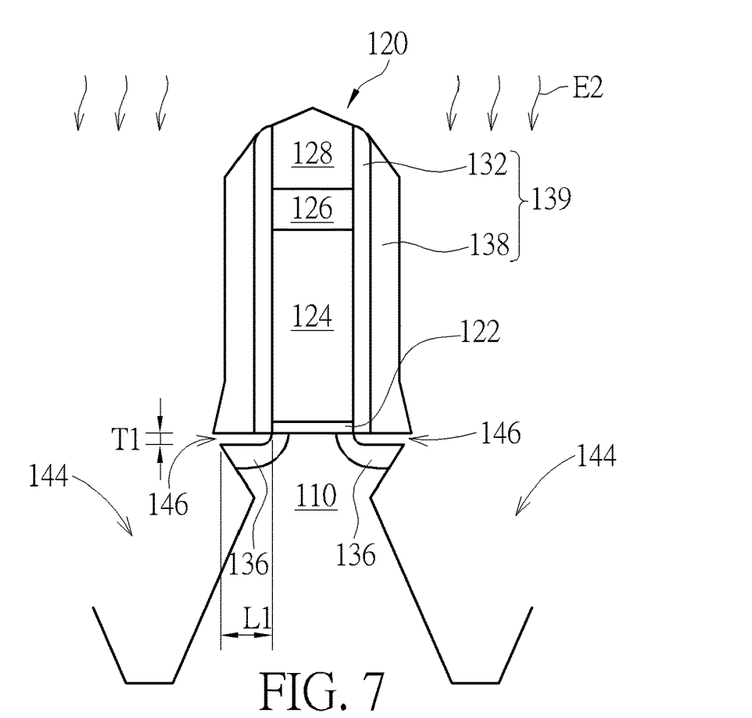
FIG. 7 shows the step of forming a deep recess in the substrate.

Please refer to FIG. 6 and FIG. 7, which sequentially illustrate the process of forming a deep recess 144 in the substrate 110 at two sides of the gate structure 120 by performing an etching process. Preferably, the etching process may include multiple etching steps to form the deep recess 144 with a pre-determined shape. For example, as shown in FIG. 6, a dry etching process E1 may first be performed, using the gate structure 120 and the spacer 139 as an etching mask to anisotropically etching the substrate 110 thereby defining a first recess 142 in the substrate 110 at two sides of the gate structure 120 and adjacent to the spacer 139. The first etching process E1 may be a reactive ion etching (RIE) process using etchant gas including $Cl_2$, HBr, $SF_6$, or a mixture thereof, but not limited thereto. As shown in FIG. 6, the substrate 110 exposed from the first recess 142 may have a sidewall 142a that is vertical to the upper surface of the substrate 110 and aligned with the bottom edge of the second spacer 138. The shallow doped region 134 and the lightly doped region 136 are exposed from the sidewall 142a of the substrate 110.

Following, as shown in FIG. 7, a wet etching process E2 is performed to further etch the substrate 110 through the first recess 142, thereby expanding the first recess 142 into the deep recess 144. The wet etching process E2 may use alkaline etching solution including KOH, NaOH, $N_2H_4$, CsOH, TMAH, or EDP, or a mixture thereof to etch the substrate 110. Preferably, the alkaline etching solution of the second etching process E2 comprises TMAH. The wet etching process E2 may have different etching rates for different crystal surfaces of the substrate 110. For example, the wet etching process E2 may etch the substrate 110 much slower on a <111> crystal surface than on a <100> or <110> crystal surface of the substrate 110. Due to the crystal orientation selectivity of the wet etching process E2, the vertical sidewall 142a of the substrate 110 may be etched into an inclined sidewall that is the crystal surface of the substrate 110 having slower etching rate during the second etching process E2 and may not be vertical to the upper surface of the substrate 110, such as a <111> crystal surfaces of the substrate 110. Accordingly, after the wet etching process E2, the first recess 142 is expanded into the deep recess 144 having a desired diamond-shaped cross-sectional profile.

Notably, the shallow doped region 134, which is substantially an at least partially amorphized region of the substrate 110, may have a relatively faster etching rate with respective to other regions of the substrate 110 during the wet etching process E2. Therefore, after the wet etching process E2, the shallow doped region 134 may be removed and an air gap 146 may be formed between the spacer 139 and substrate 110. As shown in FIG. 7, the air gap 146 has an opening exposed from the deep recess 144 and having a width T1. The air gap 146 has a length extending from the opening toward the gate structure 120 and between the spacer 139 and the substrate 110. As shown in FIG. 7, the air gap 146 may extends to reach the sidewall of the gate structure 110 and completely intervenes between the spacer 139 and the substrate 110. In this case, the bottom of the spacer 139 may be completely overlapped on the air gap 146 and not in direct contact with the substrate 110. In other embodiments, the air gap 146 may not extend to reach the sidewall of the gate structure 120. For example, the air gap 146 may only extend to a point directly under the first spacer 132 and completely intervenes between the second spacer 138 and the substrate 110 while partially intervenes between the first spacer 132 and the substrate 110. In this case, only the bottom of the second spacer 138 is completely overlapped on the air gap 146 and not in direct contact with the substrate 110. The bottom of the first spacer 132 not overlapped on the air gap 146 may directly contact the substrate 110. Preferably, the width T1 of the opening of the air gap 146 is between 10 to 40 angstroms. As shown in FIG. 7, the boundary between the air gap 146 and the substrate 110 may be encompassed by the lightly-doped region 136. The lightly-doped region 136 is in direct contact with the source/drain region 150.

Figure 8:
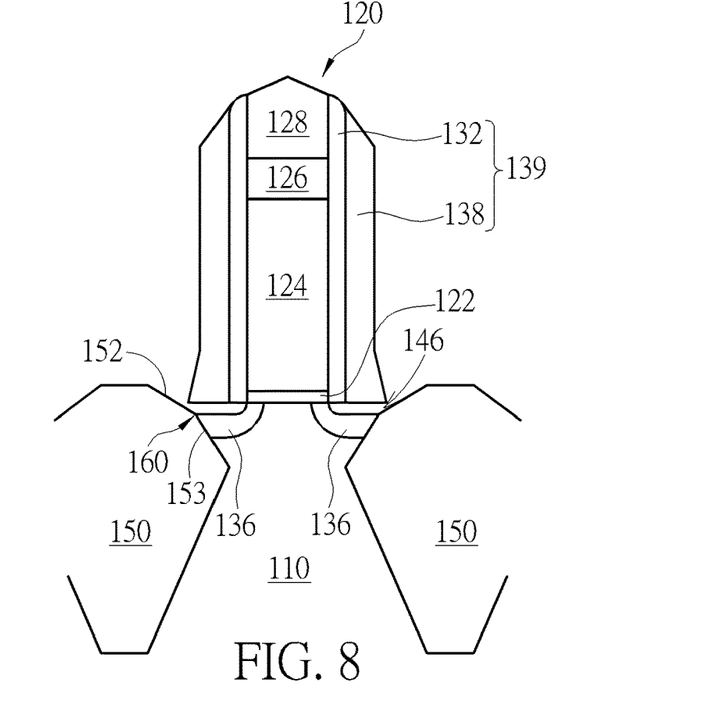
FIG. 8 shows the step of forming a source/drain region in the deep recess.

Please refer to FIG. 8. After forming the deep recess 144 and the air gap 146, an epitaxial growing process may be performed to form a source/drain region 150 in the deep recess 144. During the epitaxial growing process, the epitaxial layer may grow from the exposed surface of the substrate 110 exposed in the deep recess 144 until completely filling the deep recess 144 and then overgrow to form a raised portion higher than the upper surface of the substrate 110. It is one feature of the present invention that, by forming the air gap 146 having a very small opening, such as only between 10 to 40 angstroms in width T1, the epitaxial layer will not grow in the air gap 146. Rather, the air gap 146 may create a heterogeneous interface between the exposed surface of the substrate 110 and the sidewall of the second spacer 138, which is not preferable for the epitaxial growth and may force the epitaxial layer to grow along a direction away from the air gap 146 when the epitaxial layer meets the boundary 160 between the air gap 146 and the substrate 110. A faceted surface 152 of the raised portion of the source/drain region 150 is therefore formed. According to an embodiment, the faceted surface 152 may be a <311> crustal surface of the source/drain region 150. In this way, the raised portion of the source/drain region 150 will not cover on the sidewall of the second spacer 138. As shown in FIG. 8, the faceted surface 152 is an exterior surface of the source/drain region 150 that is exposed from the substrate 110 and borders the substrate 110 on the boundary 160 between the air gap 146 and the substrate 110. The source/drain region 150 may further have an interior surface 153 that is completely embedded in the substrate 110 and adjoins the faceted surface 150 on the boundary 160 between the air gap 146 and the substrate 110.

According to an embodiment, the source/drain region 150 may comprise dopants and have a lattice constant different from a lattice constant of the substrate 110 to provide stress to the channel region of the semiconductor device. The dopants may be in-situ added to the source/drain region 150 during the epitaxial growing process. According to an embodiment, the material of the dopants may be chosen from a group comprising P, C, As, InGaAs, Ge, InAs, InP or Group III-V semiconductor compound, depending on the conductive type of the semiconductor device. Furthermore, the source/drain region 150 may comprise conductive dopants to increase drive current of the semiconductor device. According to an embodiment, the conductive dopants may comprise P, As or Sb when the semiconductor device is a n-type transistor. On the other hand, the conductive dopants may comprise B or $BF_2$ when the semiconductor device is a p-type transistor. The conductive dopants may be in-situ added to the source/drain region 150 during the epitaxial growing process, or by performing an ion implantation process after the epitaxial growing process.

Figure 9:
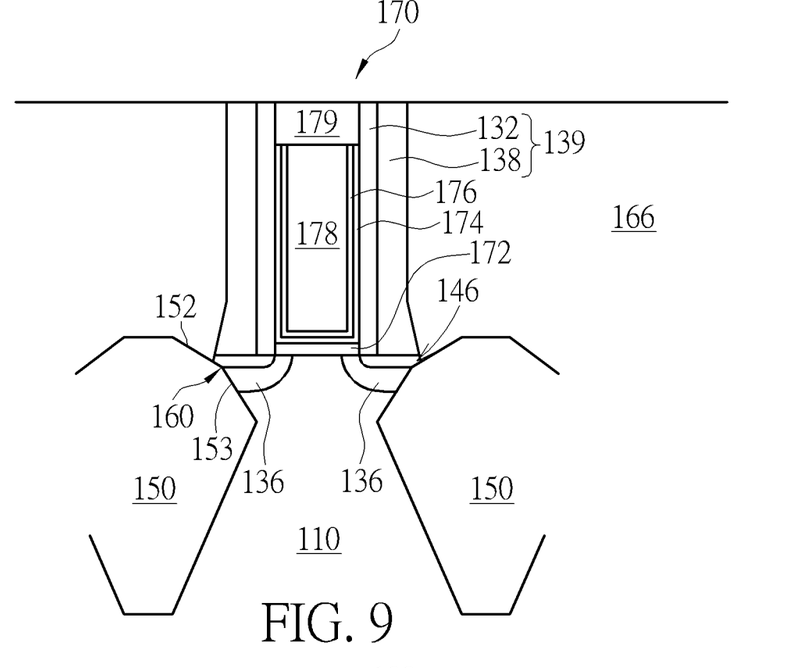
FIG. 9 shows the step of forming an interlayer dielectric layer on the substrate and replacing the gate structure with a replacement metal gate structure.

Please refer to FIG. 9. Subsequently, an interlayer dielectric layer 166 is deposited on the substrate 110, covering the gate structure 120, the spacer 139 and the source/drain region 150. After planarizing the interlayer dielectric layer 166 and exposing a top surface of the gate structure 120, such as a surface of the pad layer 126, a replacement metal gate (RMG) process is performed to replace the gate structure 120 with a metal gate structure 170. The replacement metal gate (RMG) process may be conventional and would not be illustrated herein for the sake of simplicity. The interlayer dielectric layer 166 may comprise multiple layers made of different materials. For example, the interlayer dielectric layer 166 may have a contact etching stop layer (not shown) made of silicon nitride to serve as an etching stop layer for defining the contact holes (not shown) in the interlayer dielectric layer 166, and a dielectric layer (not shown) on the contact etching stop layer and made of silicon oxide or low-k dielectric material. According to an embodiment, the interlayer dielectric layer 166 will not fill into the air gap 146 when the width T1 of the opening of the air gap 146 is small, and sealing the air gap 146 between the spacer 139 and the substrate 110.

As shown in FIG. 9, the metal gate structure 170 may include an interfacial layer 172, a high-k dielectric layer 174, a work-function metal layer 176, a low-resistance metal layer 178 and a cap layer 179. The material of the interfacial layer 172 may comprise silicon oxide, but not limited thereto. The material of the high-k dielectric layer 174 may include hafnium oxide (HfO), hafnium silicon oxide (HfSiO), hafnium silicon oxynitride (HfSiON), aluminum oxide (AlO), lanthanum oxide (LaO), lanthanum aluminum oxide (LaAlO), tantalum oxide (TaO), zirconium oxide (ZrO), strontium zirconium silicon oxide (ZrSiO), or hafnium zirconium oxide (HfZrO), but not limited thereto. The material of the work-function metal layer 176 is chosen depending on the conductive type of the semiconductor device. For example, when the semiconductor device is an n-typed transistor, the work function metal layer 176 may comprise titanium aluminide (TiAl), zirconium aluminide (ZrAl), tungsten aluminide (WAl), tantalum aluminide (TaAl), or hafnium aluminide (HfAl), but not limited thereto. On the other hand, when the semiconductor device is a p-typed transistor, the work function metal layer 176 may comprise TiN, TaN, titanium carbide (TiC), tantalum carbide (TaC), tungsten carbide (WC), or aluminum titanium nitride (TiAlN), but not limited thereto. The material of the low-resistance metal layer 178 may include Al, Ti, Ta, W, Nb, Mo, Cu, TiN, TiC, TaN, Ti/W and Ti/TiN, but not limited thereto. The material of the cap layer 179 may include silicon nitride, but not limited thereto.

Figure 10:
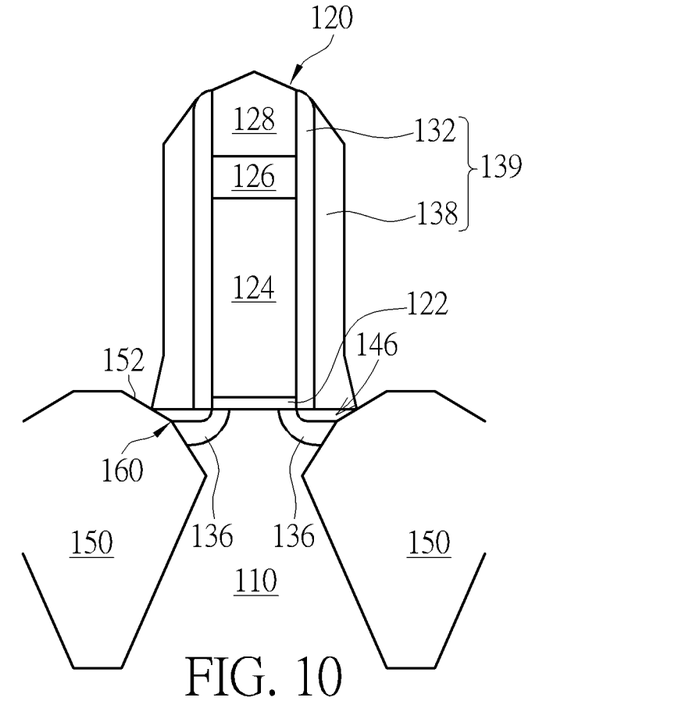
FIG. 10 is a schematic cross-sectional diagram illustrating a variant of the preferred embodiment as shown in FIG. 1 to FIG. 9.

Please refer to FIG. 10, which is a schematic cross-sectional diagram illustrating a variant of the preferred embodiment previously illustrated. The step shown in FIG. 10 corresponds to the step shown in FIG. 8. During the wet etching process E2, more substrate 110 may be removed and the etched inclined sidewall of the substrate 110 exposed in the deep recess 144 may be laterally shifted to be closer to the channel region under the gate structure 120. Consequently, as shown in FIG. 10, after the epitaxial growing process, the faceted surface 152 of the source/drain region 150 may touch the bottom edge of the second spacer 138. In this case, the air gap 146 may be sealed between the spacer 139 and the substrate 110 by the source/drain region 150 before forming the interlayer dielectric layer 166.

Overall, the present invention provides an improved semiconductor device and manufacturing process thereof, which particularly forms a small air gap between the spacer and the substrate before performing the epitaxial growing process for forming the source/drain region. The small air gap may force the epitaxial layer to grow along a direction away from the spacer, thereby preventing the epitaxial layer from covering on the bottom sidewall of the spacer. The parasitic capacitance between the source/drain region and the gate of the semiconductor device is therefore reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
    a substrate;
    a gate structure disposed on the substrate;
    a spacer disposed on the substrate and covering a sidewall of the gate structure;
    an air gap disposed between the spacer and the substrate;
    a source/drain region formed in the substrate and having a faceted surface exposed from the substrate, wherein the faceted surface borders the substrate on a boundary between the air gap and the substrate.
2. The semiconductor device according to claim 1, wherein the source/drain region further comprises an interior surface adjoining the faceted surface on the boundary between the air gap and the substrate and being completely embedded in the substrate.
3. The semiconductor device according to claim 1, wherein the air gap extends between the spacer and the substrate toward the gate structure and completely intervenes between the spacer and the substrate, wherein the spacer is completely overlapped on the air gap and not in direct contact with the substrate.
4. The semiconductor device according to claim 1, wherein the spacer comprises a first spacer and a second spacer, the first spacer being disposed between the second spacer and the gate structure.
5. The semiconductor device according to claim 4, wherein the air gap extends between the second spacer and the substrate to completely intervene between the second spacer and the substrate and partially intervene between the first spacer and the substrate, and the second spacer is completely overlapped on the air gap and not in direct contact with the substrate.
6. The semiconductor device according to claim 1, further comprising a lightly-doped region formed in the substrate and encompassing the air gap.
7. The semiconductor device according to claim 1, further comprising an interlayer dielectric layer disposed on the substrate, covering the gate structure, the spacer and the source/drain region and sealing the air gap.
8. The semiconductor device according to claim 1, wherein the air gap is sealed by the source/drain region.
9. The semiconductor device according to claim 1, wherein the air gap has an opening having a width between 10 and 40 angstroms.
10. The semiconductor device according to claim 1, wherein the faceted surface is a <311> crystal surface of the source/drain region.
11. A method for forming a semiconductor device, comprising:
    providing a substrate;
    forming a gate structure on the substrate;
    forming a shallow doped region in the substrate adjacent to the gate structure;
    forming a spacer on the shallow doped region in substrate and on a sidewall of the gate structure;
    performing an etching process to form a deep recess in the substrate adjacent to the spacer and an air gap between the spacer and the substrate; and
    performing an epitaxial process to form a source/drain region completely filling the deep recess, wherein the faceted surface borders the substrate on a boundary between the air gap and the substrate.
12. The method for forming the semiconductor device according to claim 11, wherein the source/drain region does not fill into the air gap.
13. The method for forming the semiconductor device according to claim 11, wherein the shallow doped region is removed by the etching process to form the air gap.
14. The method for forming the semiconductor device according to claim 11, wherein the steps of forming the shallow doped region and the spacer comprise:
    forming a first spacer on the sidewall of the gate structure;
    performing a first implanting process, using the gate structure and the first spacer as a mask to implant amorphizing ions at a first tilted angle into the substrate to form the shallow doped region; and
    forming a second spacer on the shallow doped region and on the first spacer, wherein the first spacer and the second spacer collectively form the spacer.
15. The method for forming the semiconductor device according to claim 14, wherein the amorphizing ions comprise xenon (Xe).
16. The method for forming the semiconductor device according to claim 14, further comprising performing a second implanting process before forming the second spacer, wherein the second implanting process uses the gate structure and the first spacer as a mask to implant conductive dopants at a second tilted angle into the substrate to form a lightly doped region in the substrate adjacent to the gate structure, wherein the lightly doped region has a depth deeper than the shallow doped region and encompasses the shallow doped region.

17. The method for forming the semiconductor device according to claim 14, wherein the first tilt angle is smaller than the second tilt angle.

18. The method for forming the semiconductor device according to claim 11, wherein the etching process comprises:
   performing a dry etching process, using the gate structure and the spacer as an etching mask to etch the substrate thereby forming a first recess in the substrate adjacent to the spacer, wherein the shallow doped region is exposed form the first recess; and
   performing a wet etching process to etch the substrate and the shallow doped region through the first recess thereby forming the deep recess and the air gap.

19. The method for forming the semiconductor device according to claim 18, wherein the wet etching process uses TMAH as an etchant.

20. The method for forming the semiconductor device according to claim 11, further comprising forming an interlayer dielectric layer on the substrate, covering the gate structure, the spacer and the source/drain region and sealing the air gap.

* * * * *